US006967711B2

(12) United States Patent
Gui

(10) Patent No.: US 6,967,711 B2
(45) Date of Patent: Nov. 22, 2005

(54) LITHOGRAPHIC APPARATUS AND DEVICE MANUFACTURING METHOD

(75) Inventor: Cheng-Qun Gui, Best (NL)

(73) Assignee: ASML Netherlands B.V., Veldhoven (NL)

( * ) Notice: Subject to any disclaimer, the term of this patent is extended or adjusted under 35 U.S.C. 154(b) by 79 days.

(21) Appl. No.: 10/795,802

(22) Filed: Mar. 9, 2004

(65) Prior Publication Data

US 2005/0200820 A1    Sep. 15, 2005

(51) Int. Cl.$^7$ .......................... G03B 27/54; G03B 27/42
(52) U.S. Cl. ........................................... 355/67; 355/53
(58) Field of Search .............................. 355/52, 53, 55, 355/67–71; 430/5, 20, 311; 250/548, 492.22; 356/399–401; 359/618, 663

(56) References Cited

U.S. PATENT DOCUMENTS

| | | | |
|---|---|---|---|
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,677,703 A | 10/1997 | Bhuva et al. | |
| 5,808,797 A | 9/1998 | Bloom et al. | |
| 5,982,553 A | 11/1999 | Bloom et al. | |
| 6,133,986 A * | 10/2000 | Johnson | 355/67 |
| 6,177,980 B1 | 1/2001 | Johnson | |
| 6,424,404 B1 * | 7/2002 | Johnson | 355/44 |
| 6,687,041 B1 | 2/2004 | Sandstrom | |
| 6,747,783 B1 | 6/2004 | Sandstrom | |
| 6,795,169 B2 | 9/2004 | Tanaka et al. | |
| 6,806,897 B2 | 10/2004 | Kataoka et al. | |
| 6,811,953 B2 | 11/2004 | Hatada et al. | |
| 6,841,787 B2 * | 1/2005 | Almogy | 250/492.24 |
| 2004/0041104 A1 | 3/2004 | Liebregts et al. | |
| 2004/0130561 A1 | 7/2004 | Jain | |

FOREIGN PATENT DOCUMENTS

EP    1 482 375 A2    12/2004

* cited by examiner

Primary Examiner—Henry Hung Nguyen
(74) Attorney, Agent, or Firm—Sterne, Kessler, Goldstein & Fox P.L.L.C.

(57) ABSTRACT

A system and method are used to form features on a substrate. The system and method include using a first array including individually controllable elements that selectively pattern a beam of radiation, a second array including sets of lenses and apertures stops that form an image from a respective one of the individually controllable elements in a first plane, a third array including lenses that form an image from a respective one of the second array in a second plane, and a substrate table that holds a substrate in the second plane, such that the substrate receives the image from the respective one of the second array. A same spacing is formed between elements in the first, second, and third arrays.

7 Claims, 5 Drawing Sheets

LITHOGRAPHIC APPARATUS AND DEVICE MANUFACTURING METHOD

BACKGROUND OF THE INVENTION

1. Field of the Invention

The present invention relates to a lithographic apparatus and a device manufacturing method.

2. Related Art

A lithographic apparatus is a machine that applies a desired pattern onto a target portion of a substrate. The lithographic apparatus can be used, for example, in the manufacture of integrated circuits (ICs), flat panel displays and other environments requiring patterning of fine structures. In a conventional lithographic apparatus, a patterning device, which is alternatively referred to as a mask or a reticle, may be used to generate a circuit pattern corresponding to an individual layer of the IC (or other device), and this pattern can be imaged onto a target portion (e.g., part of one or several dies) on a substrate (e.g., a silicon wafer, glass plate, or the like) that has a layer of radiation-sensitive material (e.g., resist). In a maskless lithography system, instead of a mask, the patterning device may include an array of individually controllable elements that generate the circuit pattern.

In general, a single substrate will contain a network of adjacent target portions that are successively exposed. Known lithographic apparatus include steppers, in which each target portion is irradiated by exposing an entire pattern onto the target portion in one go, and scanners, in which each target portion is irradiated by scanning the pattern through the projection beam in a given direction (the "scanning"-direction), while synchronously scanning the substrate parallel or anti-parallel to this direction.

In view of the high costs of masks for use in lithographic processes and the length of time required to manufacture them, maskless lithographic systems including programmable patterning devices (e.g., spatial light modulators, contrast devices, etc.) have been developed. The programmable patterning devices are programmed (e.g., electronically or optically) to form the desired mask pattern and impart it to the projection beam. Types of programmable patterning means that have been proposed include micromirror arrays, LCD arrays, grating light valve arrays, and the like.

An example lithographic apparatus employing a programmable patterning device is found in U.S. Pat. No. 6,498,685 (the '685 patent), which is incorporated herein by reference in its entirety. In the '685 patent, a collimated illumination beam is directed onto a micro-mirror array so that the mirrors of the micro-mirror array either direct light via a beam expander onto a respective microlens in a microlens array or direct light out of the optical system. Example systems using microlens arrays to project images of masks are disclosed in U.S. Pat. No. 5,517,279 and PCT Patent Application WO 94/11781. The microlens array forms an array of small spots on a substrate and the micro-mirrors effectively act as switches to turn individual spots in the array of small spots ON and OFF. By scanning the substrate relative to the array of small spots, which is inclined to the scanning direction, as the spots are selectively activated, features corresponding to a pattern in the micro-mirror array can be built up on the substrate.

The beam expander is desirable to create a useful size imaging field because the programmable patterning device is relatively small. However, this means that the array of small spots at the substrate level is quite sparse and if the spots are small, to give a reasonable resolution, the array must be wide and inclined at only a small angle to the scanning direction in order to be able to address the whole surface of the substrate. The beam expander is complex and requires a significant amount of space. It is also a significant additional cost and additional source of errors, especially a large field lens in the beam expander. Furthermore, it reduces the optical transmission of the apparatus.

Therefore, what is needed is system and method using a lithographic projection apparatus without a beam expander that includes a programmable patterning device in which the lithographic projection apparatus can be simpler in structure than conventional devices and more compact.

SUMMARY OF THE INVENTION

An embodiment of the present invention provides a lithographic apparatus including an illumination system for supplying a beam of radiation, a patterning array including individually controllable elements serving to selectively divide the beam of radiation into a plurality of sub-beams modulated according to a desired pattern, an array of microlens sets, each microlens set forming an image of a respective one of the individually controllable elements in a first plane and having an aperture stop, an array of field microlenses, each field microlens forming an image of the aperture stop of a respective one of the microlens sets in an image plane, and a substrate table for supporting a substrate in the image plane. In this embodiment, there is no beam expander, so the image field is the same size as the patterning array.

In one embodiment, a spacing of the patterning array, the array of microlens sets, and the array of field microlenses can be the same. When the three arrays (i.e., the patterning array, microlens set array, and field microlens array) all have the same spacing, a simple and compact lithographic apparatus can result.

For example, the lithographic apparatus can be made by use of a large patterning array, which can be produced lithographically. The large patterning array can be sized to substantially pattern a whole substrate (e.g., a 200 mm or 300 mm silicon or quartz glass wafer) during one exposure.

In one embodiment, the microlens arrays, both those of the microlens sets and of the field microlenses, and the array of aperture stops can likewise be formed lithographically. Accurate registration of the different arrays can be ensured by using a single mask or mask set to form the basic array structure for each array. All the arrays are preferably manufactured in a single batch and/or using the same process, to improve uniformity.

Another embodiment of the present invention provides a device manufacturing method including the steps of providing a substrate, providing a projection beam of radiation using an illumination system, using a patterning array including individually controllable elements to selectively divide the beam of radiation into a plurality of sub-beams modulated according to a desired pattern, forming an image of each of the individually controllable elements in a first plane using an array of microlens sets, each microlens set having an aperture stop, forming an image of the aperture stop of a respective one of the microlens sets in an image plane using an array of field microlenses, and supporting the substrate in the image plane.

In one embodiment, the spacing of the patterning array, the array of microlens sets, and the array of field microlenses can be the same.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

The present invention will now be described with reference to the accompanying drawings. In the drawings, like reference numbers may indicate identical or functionally similar elements.

DETAILED DESCRIPTION OF THE INVENTION

Overview and Terminology

Figure 1:
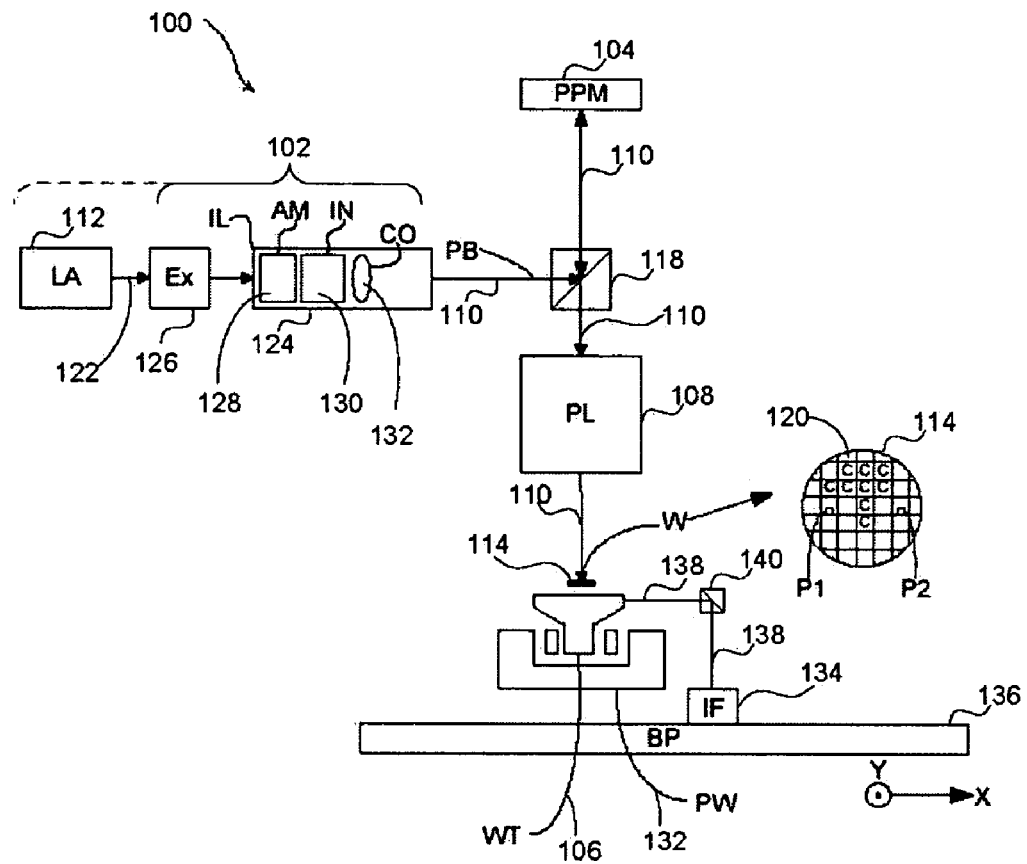
FIG. 1 depicts a lithographic apparatus according to a first embodiment of the present invention.

The term "array of individually controllable elements" as here employed should be broadly interpreted as referring to any device that can be used to endow an incoming radiation beam with a patterned cross-section, so that a desired pattern can be created in a target portion of the substrate. The terms "light valve" and "Spatial Light Modulator" (SLM) can also be used in this context. Examples of such patterning devices are discussed below.

A programmable mirror array may comprise a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter may filter out the diffracted light, leaving the undiffracted light to reach the substrate. An array of diffractive optical micro electrical mechanical system (MEMS) devices can also be used in a corresponding manner. Each diffractive optical MEMS device can include a plurality of reflective ribbons that can be deformed relative to one another to form a grating that reflects incident light as diffracted light.

A further alternative embodiment can include a programmable mirror array employing a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means.

In both of the situations described hereabove, the array of individually controllable elements can comprise one or more programmable mirror arrays. More information on mirror arrays as here referred to can be gleaned, for example, from U.S. Pat. No. 5,296,891 and U.S. Pat. No. 5,523,193, and PCT patent applications WO 98/38597 and WO 98/33096, which are incorporated herein by reference in their entireties.

A programmable LCD array can also be used. An example of such a construction is given in U.S. Pat. No. 5,229,872, which is incorporated herein by reference in its entirety.

It should be appreciated that where pre-biasing of features, optical proximity correction features, phase variation techniques and multiple exposure techniques are used, for example, the pattern "displayed" on the array of individually controllable elements may differ substantially from the pattern eventually transferred to a layer of or on the substrate. Similarly, the pattern eventually generated on the substrate may not correspond to the pattern formed at any one instant on the array of individually controllable elements. This may be the case in an arrangement in which the eventual pattern formed on each part of the substrate is built up over a given period of time or a given number of exposures during which the pattern on the array of individually controllable elements and/or the relative position of the substrate changes.

Although specific reference may be made in this text to the use of lithographic apparatus in the manufacture of ICs, it should be understood that the lithographic apparatus described herein may have other applications, such as, for example, the manufacture of DNA chips, MEMS, MOEMS, integrated optical systems, guidance and detection patterns for magnetic domain memories, flat panel displays, thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The term "projection system" used herein should be broadly interpreted as encompassing various types of projection system, including refractive optical systems, reflective optical systems, and catadioptric optical systems, as appropriate, for example, for the exposure radiation being used, or for other factors such as the use of an immersion fluid or the use of a vacuum. Any use of the term "lens" herein may be considered as synonymous with the more general term "projection system."

The illumination system may also encompass various types of optical components, including refractive, reflective, and catadioptric optical components for directing, shaping, or controlling the projection beam of radiation, and such components may also be referred to below, collectively or singularly, as a "lens."

The lithographic apparatus may be of a type having two (e.g., dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index (e.g., water), so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

Further, the apparatus may be provided with a fluid processing cell to allow interactions between a fluid and irradiated parts of the substrate (e.g., to selectively attach chemicals to the substrate or to selectively modify the surface structure of the substrate).

Lithographic Projection Apparatus

FIG. 1 schematically depicts a lithographic projection apparatus 100 according to an embodiment of the invention. Apparatus 100 includes at least a radiation system 102 (e.g., EX, IL (e.g., AM, IN, CO, etc.) etc.), an array of individually controllable elements PPM 104, an object table WT 106 (e.g., a substrate table), and a projection system ("lens") PL 108.

Radiation system 102 can be used for supplying a projection beam PB 110 of radiation (e.g., UV radiation), which in this particular case also comprises a radiation source LA 112.

Array of individually controllable elements 114 (e.g., a programmable mirror array) can be used for applying a pattern to the projection beam 110. In general, the position of the array of individually controllable elements 114 can be fixed relative to projection system 108. However, in an alternative arrangement, an array of individually controllable elements 114 may be connected to a positioning device (not shown) for accurately positioning it with respect to projection system 108. As here depicted, individually controllable elements 114 are of a reflective type (e.g., have a reflective array of individually controllable elements).

Object table 106 can be provided with a substrate holder (not specifically shown) for holding a substrate W 114 (e.g., a resist-coated silicon wafer or glass substrate) and object table 106 can be connected to positioning device PW 116 for accurately positioning substrate 114 with respect to projection system 108.

Projection system (e.g., a lens) 108 (e.g., a quartz and/or CaF$_2$ lens system or a catadioptric system comprising lens elements made from such materials, or a mirror system) can be used for projecting the patterned beam received from beam splitter 118 onto a target portion C 120 (e.g., one or more dies) of the substrate 114. The projection system 108 may project an image of the array of individually controllable elements 114 onto the substrate 114. Alternatively, the projection system 108 may project images of secondary sources for which the elements of the array of individually controllable elements 114 act as shutters. The projection system 108 may also comprise a micro lens array (MLA) to form the secondary sources and to project microspots onto the substrate 114.

The source 112 (e.g., an excimer laser) can produce a beam of radiation 122. This beam 122 is fed into an illumination system (illuminator) IL 124, either directly or after having traversed conditioning device 126, such as a beam expander Ex, for example. The illuminator 124 may comprise adjusting device AM 128 for setting the outer and/or inner radial extent (commonly referred to as σ-outer and σ-inner, respectively) of the intensity distribution in the beam 122. In addition, it will generally comprise various other components, such as an integrator IN 130 and a condenser CO 132. In this way, the beam 110 impinging on the array of individually controllable elements 114 has a desired uniformity and intensity distribution in its cross-section.

It should be noted, with regard to FIG. 1, that the source 112 may be within the housing of the lithographic projection apparatus 100 (as is often the case when the source 112 is a mercury lamp, for example). In alternative embodiments, source 112 may also be remote from the lithographic projection apparatus 100. In this case, radiation beam 122 would be led into the apparatus 100 (e.g., with the aid of suitable directing mirrors). This latter scenario is often the case when the source 112 is an excimer laser. It is to be appreciated that both of these scenarios are contemplated within the scope of the present invention.

The beam 110 subsequently intercepts the array of individually controllable elements 114 after being directing using beam splitter 118. Having been reflected by the array of individually controllable elements 114, the beam 110 passes through the projection system 108, which focuses the beam 110 onto a target portion 120 of the substrate 114.

With the aid of the positioning device 116 (and optionally interferometric measuring device IF 134 on base plate BP 136 that receives interferometric beams 138 via beam splitter 140), the substrate table 106 can be moved accurately, so as to position different target portions 120 in the path of the beam 110. Where used, the positioning device for the array of individually controllable elements 114 can be used to accurately correct the position of the array of individually controllable elements 114 with respect to the path of the beam 110, e.g., during a scan. In general, movement of the object table 106 is realized with the aid of a long-stroke module (course positioning) and a short-stroke module (fine positioning), which are not explicitly depicted in FIG. 1. A similar system may also be used to position the array of individually controllable elements 114. It will be appreciated that the projection beam 110 may alternatively/additionally be moveable while the object table 106 and/or the array of individually controllable elements 114 may have a fixed position to provide the required relative movement.

In an alternative configuration of the embodiment, the substrate table 106 may be fixed, with the substrate 114 being moveable over the substrate table 106. Where this is done, the substrate table 106 is provided with a multitude of openings on a flat uppermost surface, gas being fed through the openings to provide a gas cushion which is capable of supporting the substrate 114. This is conventionally referred to as an air bearing arrangement. The substrate 114 is moved over the substrate table 106 using one or more actuators (not shown), which are capable of accurately positioning the substrate 114 with respect to the path of the beam 110. Alternatively, the substrate 114 may be moved over the substrate table 106 by selectively starting and stopping the passage of gas through the openings.

Although the lithography apparatus 100 according to the invention is herein described as being for exposing a resist on a substrate, it will be appreciated that the invention is not limited to this use and the apparatus 100 may be used to project a patterned projection beam 110 for use in resistless lithography.

The depicted apparatus 100 can be used in four preferred modes:

1. Step mode: the entire pattern on the array of individually controllable elements 114 is projected in one go (i.e., a single "flash") onto a target portion 120. The substrate table 106 is then moved in the x and/or y directions to a different position for a different target portion 120 to be irradiated by the beam 110.

2. Scan mode: essentially the same as step mode, except that a given target portion 120 is not exposed in a single "flash." Instead, the array of individually controllable elements 114 is movable in a given direction (the so-called "scan direction", e.g., the y direction) with a speed v, so that the projection beam 110 is caused to scan over the array of individually controllable elements 114. Concurrently, the substrate table 106 is simultaneously moved in the same or opposite direction at a speed V=Mv, in which M is the magnification of the projection system 108. In this manner, a relatively large target portion 120 can be exposed, without having to compromise on resolution.

3. Pulse mode: the array of individually controllable elements 114 is kept essentially stationary and the entire pattern is projected onto a target portion 120 of the substrate 114 using a pulsed radiation system 102. The substrate table 106 is moved with an essentially constant speed such that the projection beam 110 is caused to scan a line across the substrate 106. The pattern on the array of individually controllable elements 114 is updated as required between pulses of the radiation system 102 and the pulses are timed such that successive target portions 120 are exposed at the required locations on the substrate 114. Consequently, the projection beam 110 can scan across the substrate 114 to expose the complete pattern for a strip of the substrate 114. The process is repeated until the complete substrate 114 has been exposed line by line.

4. Continuous scan mode: essentially the same as pulse mode except that a substantially constant radiation system 102 is used and the pattern on the array of individually controllable elements 114 is updated as the projection beam 110 scans across the substrate 114 and exposes it.

Combinations and/or variations on the above described modes of use or entirely different modes of use may also be employed.

Exemplary Imaging Arrangements

Figure 2:
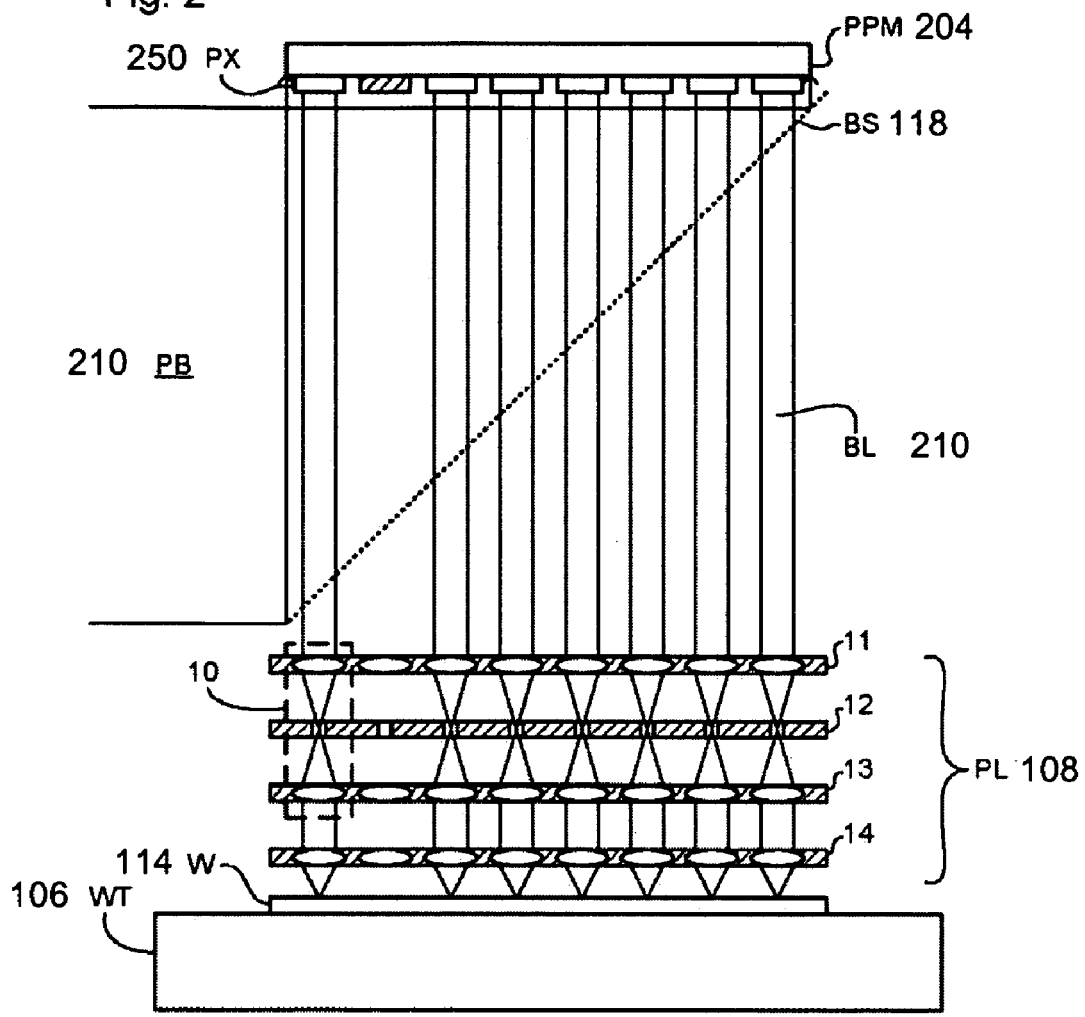
FIG. 2 depicts a patterning device, projection system, and substrate table of the apparatus in FIG. 1 in greater detail according to en embodiment of the present invention.

FIG. 2 shows a configuration of an imaging arrangement of the invention according to an embodiment of the present invention. The projection beam 210 PB supplied by the radiation system 102 is directed onto the programmable patterning device 204 PPM using beam splitter 118 BS. The return sub-beams 210 BL, whose intensity is based on a state (e.g., all or partially ON or OFF) of a respective pixel 250 PX of the programmable patterning means 204, pass through the beamsplitter 118 BS into respective microlens sets 10.

In one embodiment, an array of the microlens sets 10 can include two microlens arrays 11, 13 between which is an aperture plate 12, which defines an aperture for each of the microlens sets 10. The microlens sets 10 can have a relatively low numerical aperture (NA) (e.g., NA<0.1) and each can focus the images of the corresponding pixel 250 PX onto a respective lens element of field microlens array 14, which has a relatively high NA (e.g., NA>0.1). In a preferered embodiment, NA is in the range of from about 0.15 to about 0.3. In field microlens array 14, each microlens focuses a respective one of the aperture stops in the aperture plate 12 of the corresponding microlens set 10 onto its focal plane to form an image spot. The lower NA of the microlens sets 10 can provide sufficient space between the programmable patterning device 104 and the field microlenses 14 to form desirable images, while the higher NA of the field microlenses 14 can provide a small spot for high-resolution imaging.

In this embodiment, the substrate 114 is scanned through the focal plane (image plane) of the field microlens array 14, while the sub-beams, and hence the image spots, are switched at least partially ON or fully ON and OFF by the programmable patterning device 204. Features corresponding to the pattern of the programmable patterning device 204 are formed on the substrate 114.

It will be appreciated that in this embodiment the projection system 100 can be a 1:1 projection system in that the array spacing of the image spots on the substrate 114 is the same as the array spacing of the pixels of the programmable patterning means 204 PPM. To provide improved resolution, the image spots can be much smaller that the pixels of the programmable patterning means 204.

Figure 3:
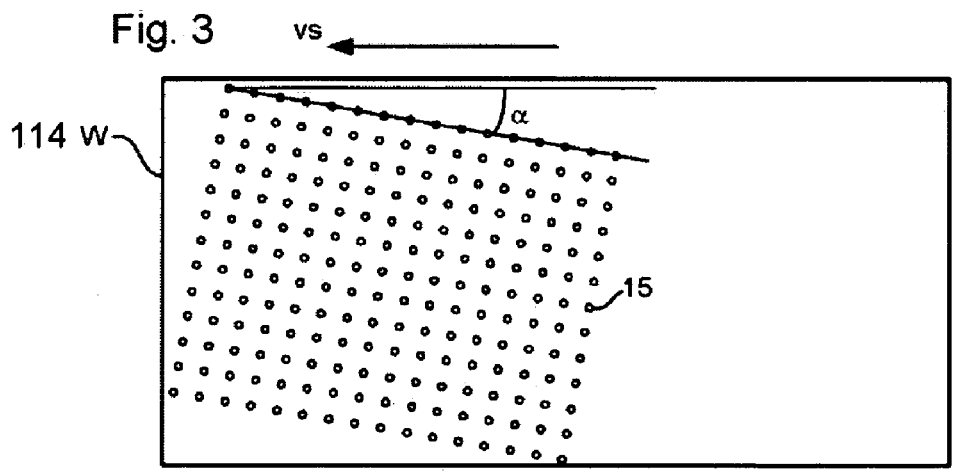
FIG. 3 is a view showing an inclination of the image spot array relative to the substrate scanning direction according to an embodiment of the present invention.

In one embodiment to ensure the whole surface area of the substrate 114 is addressed, the programmable patterning device 204 and projection systems 108 PL can be inclined to the scanning direction Vs, as shown in FIG. 3. The angle of inclination a and the width of the array in the scanning direction are determined in accordance with the image spot size and array spacing in the direction perpendicular to the scanning direction to ensure complete coverage.

In one embodiment, for large substrates a plurality of optical engines, each comprising a programmable patterning device 204 and a projection system 108, may be arranged in a staggered line across the width of the substrate 114. The different optical engines may be supplied with radiation from a common radiation source or separate sources.

In one embodiment, the patterning array, the array of microlens sets, and the array of field microlenses each have a width in the range of from about 50 mm to about 500 mm.

Other Exemplary Imaging Arrangements

Figure 4:
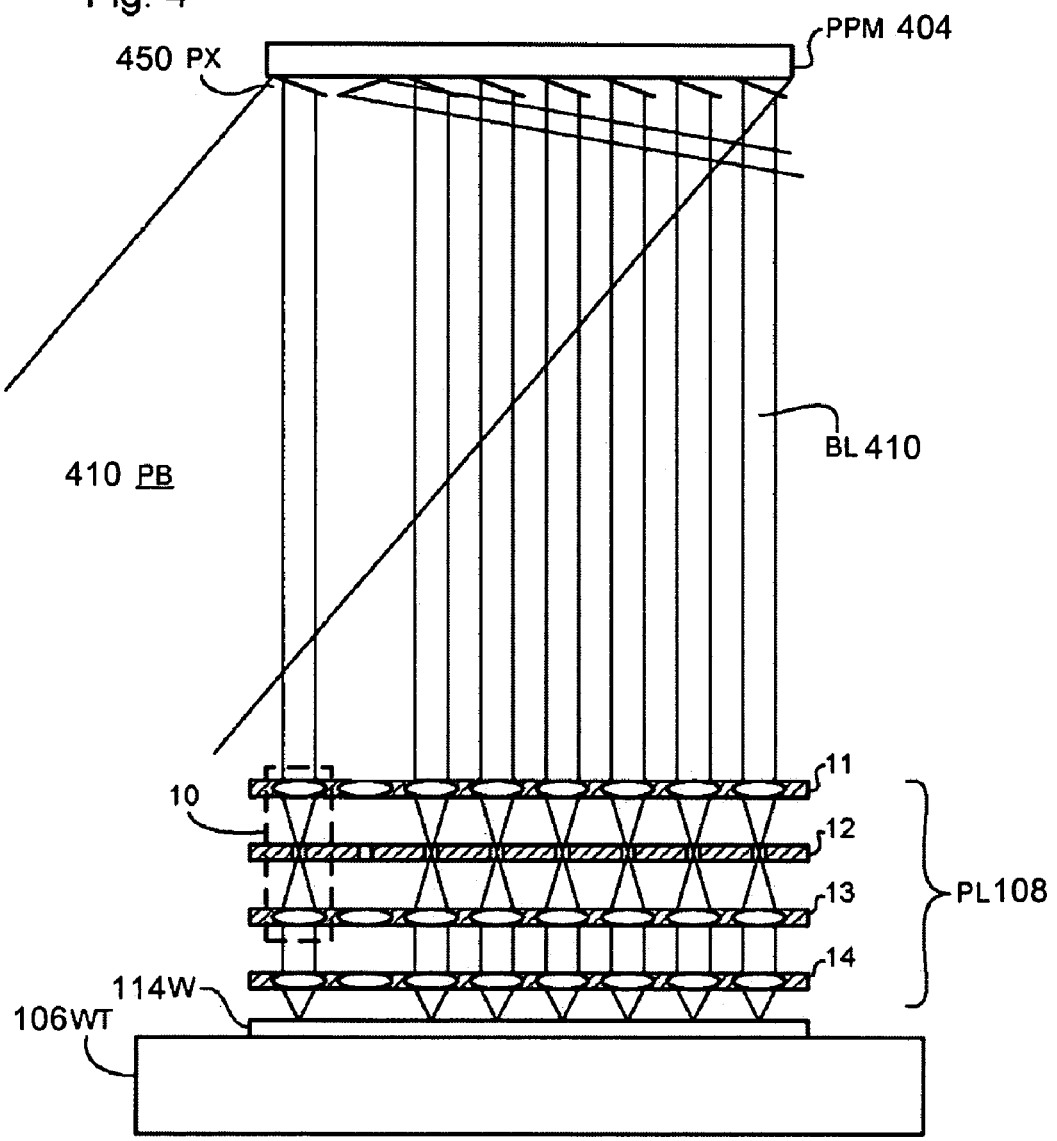
FIG. 4 depicts the patterning device, projection system, and substrate table according to another embodiment of the present invention.

FIG. 4 shows a configuration of an imaging arrangement of the invention according to an embodiment of the present invention. In this embodiment, there is no beam splitter. Although not specifically, shown, the collimated beam 410 is directed onto the programmable patterning device 404 PPM at an angle α (not shown), such that one state of the elements of the programmable patterning device 404 directs light into the microlens sets 10, while the other state directs light away from the microlens sets 10. It is to be appreciated that some programmable patterning devices 404 can include more than two states (e.g., varying ON states), which are contemplated within the scope of the present invention. The value of angle α depends on the difference in the angles light is directed by the programmable patterning device 404 in its at least two states. In one example using a digital mirror device, the mirrors commonly may be set at about ±10–15°, while in a grating light valve the first order may be at about ±25–35° to the zeroth order.

Figure 5:
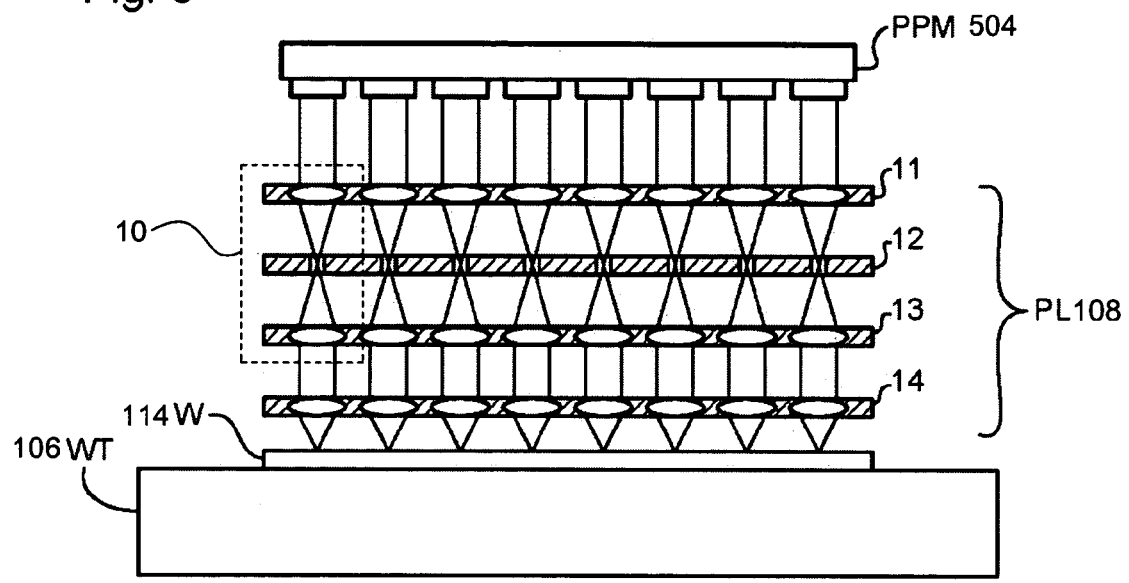
FIG. 5 depicts the patterning device, projection system and substrate table according to a still further embodiment of the present invention.

FIG. 5 shows a configuration of an imaging arrangement of the invention according to an embodiment of the present invention. In this embodiment, which may be the same as the FIG. 1 except as described below, employs a self-emissive contrast device, such as an array of light emitting diodes (LEDs), organic LEDs (OLEDs), polymer LEDs (PLEDs), or solid state laser diodes, as the programmable patterning device 504. With a self-emissive device, the beam splitter can be omitted and the device made considerably more compact.

Figure 6:
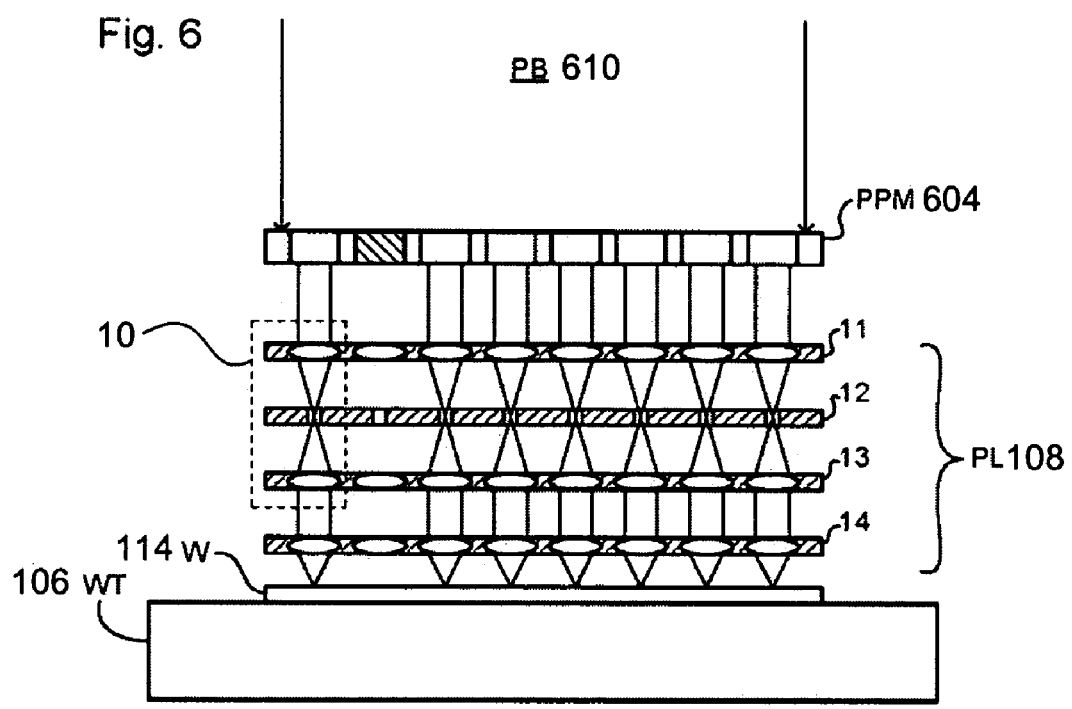
FIG. 6 depicts the patterning device, projection system, and substrate table according to a still further embodiment of the present invention.

FIG. 6 shows a configuration of an imaging arrangement of the invention according to an embodiment of the present invention. This is similar to FIG. 2, but uses a transmissive device, such as an LCD panel, as the programmable patterning device 604. As with FIG. 12, a more compact device can again be provided as compared to conventional lithographic systems.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A lithographic apparatus, comprising:
   an illumination system that supplies a beam of radiation;
   a patterning array including individually controllable elements that selectively divide the beam of radiation into a plurality of sub-beams modulated according to a desired pattern on the patterning array;
   an array of microlens sets, each microlens set having an aperture stop and forming an image from a respective one of said individually controllable elements in a first plane;
   an array of field microlenses, each field microlens forming an image of the aperture stop of a respective one of said microlens sets in a second plane; and
   a substrate table that supports a substrate in said second plane, such that the substrate is positioned to receive the image of the aperture stop;
   wherein a spacing of elements in said patterning array, said array of microlens sets, and said array of field microlenses is the same.

2. The apparatus according to claim 1, wherein said patterning array, said array of microlens sets, and said array of field microlenses each have a width in the range of from about 50 mm to about 500 mm.

3. The apparatus according to claim 1, wherein said array of microlens sets comprises a two arrays of microlenses and an array of aperture stops.

4. The apparatus according to claim 1, wherein at least two of said patterning arrays, said array of microlens sets, and said array of field microlenses are formed using a lithographic process using a single mask or mask set to form the basic array structure for each array.

5. A device manufacturing method comprising:
   producing a projection beam of radiation using an illumination system;
   selectively dividing the beam of radiation into a plurality of sub-beams modulated according to a desired pattern using a patterning array including individually controllable elements;
   forming an image of each of said individually controllable elements in a first plane using an array of microlens sets, each microlens set having an associated aperture stop; and
   forming an image of the aperture stop of a respective one of said microlens sets in a second plane using an array of field microlenses; and
   position said substrate in said second plane, such that said substrate receives the image of the aperture stop, wherein the spacing between elements in the patterning array, the array of microlens sets, and the array of field microlenses is the same.

6. A lithographic apparatus, comprising:
   a first array including individually controllable elements that selectively pattern a beam of radiation;
   a second array including sets of lenses and apertures stops that form an image from a respective one of said individually controllable elements in a first plane;
   a third array including lenses that form an image from a respective one of said second array in a second plane; and
   a substrate table that positions a substrate in said second plane, such that the substrate receives the image from the respective one of said second array, wherein a same spacing is formed between elements in said first, second, and third arrays.

7. A lithographic method, comprising:
   (a) selectively patterning a beam of radiation using individually controllable elements in a first array;
   (b) forming an image from a respective one of the individually controllable elements in a first plane using a second array including sets of lenses and apertures stops;
   (c) forming an image from a respective one of the second arrays in a second plane using a third array of lenses;
   (d) positioning a substrate in the second plane, such that the substrate receives the image from step (c); and
   (e) forming a same spacing between elements in the first, second, and third arrays.

* * * * *